United States Patent
Hsieh et al.

(10) Patent No.: US 7,084,457 B2
(45) Date of Patent: Aug. 1, 2006

(54) DMOS DEVICE HAVING A TRENCHED BUS STRUCTURE

(75) Inventors: Hsin-Huang Hsieh, Hsinchu (TW);
Chiao-Shun Chuang, Hsinchu (TW);
Chien-Ping Chang, Hsinchu (TW);
Mao-Song Tseng, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 85 days.

(21) Appl. No.: 10/774,212

(22) Filed: Feb. 5, 2004

(65) Prior Publication Data
US 2004/0217416 A1    Nov. 4, 2004

(30) Foreign Application Priority Data
Apr. 29, 2003   (TW) ............................... 92110048 A

(51) Int. Cl.
*H01L 29/76* (2006.01)
*H01L 31/062* (2006.01)

(52) U.S. Cl. ...................... 257/329; 257/330; 257/333; 257/335; 438/259; 438/270

(58) Field of Classification Search ........ 257/329–331, 257/333, 335, E29.262–265, E29.257; 438/259, 438/270, 271, 589
See application file for complete search history.

(56) References Cited

U.S. PATENT DOCUMENTS

| 4,791,462 A | * | 12/1988 | Blanchard et al. ........... 257/260 |
| 5,597,765 A | * | 1/1997 | Yilmaz et al. .............. 438/270 |
| 6,031,265 A | | 2/2000 | Hshieh |
| 6,413,822 B1 | * | 7/2002 | Williams et al. ............ 438/270 |
| 2004/0188775 A1 | * | 9/2004 | Peake et al. ................ 257/397 |

* cited by examiner

*Primary Examiner*—Tom Thomas
*Assistant Examiner*—Matthew E. Warren
(74) *Attorney, Agent, or Firm*—Townsend and Townsend and Crew LLP

(57) ABSTRACT

A DMOS device having a trench bus structure thereof is introduced. The trench bus structure comprises a field oxide layer formed on a P substrate, and a trench extending from an top surface of the field oxide layer down to a lower portion of the P substrate. A gate oxide layer and a polysilicon bus are formed to fill the trench as a main portion of the bus structure. In addition, an isolation layer and a metal line are formed atop the polysilicon bus and the field oxide layer. An opening is formed in the isolation layer to form connections between the polysilicon bus and the metal line. In specific embodiments, the bus trench and the gate trenches of the DMOS device are formed simultaneously, and the polysilicon bus and the gate electrode are formed simultaneously as well. Therefore, the bus structure is able to form the DMOS transistor without demanding any lithographic step for defining the position of the polysilicon bus.

15 Claims, 6 Drawing Sheets ized bus region were formed simultaneously.

DMOS DEVICE HAVING A TRENCHED BUS STRUCTURE

CROSS-REFERENCES TO RELATED APPLICATIONS

This application claims priority from R.O.C. Patent Application No. 092110048, filed Apr. 29, 2003, the entire disclosure of which is incorporated herein by reference.

BACKGROUND OF THE INVENTION

This invention relates to a DMOS device, and more particularly relates to a DMOS device having a trenched bus structure.

The diffused metal-oxide-semiconductor (DMOS) transistor, one of the important power transistors, is widely used in high-voltage systems such as power suppliers and power control devices. Among many reported power transistor structures, a trenched power transistor is a notable design. Some reports have suggested a trenched power transistor has better performance than a planar power transistor in both efficiency and density.

As shown in FIG. 1, a known trenched DMOS device and its gate bus are illustrated. A typical trenched transistor is illustrated on the left side of FIG. 1, comprising (1) a plurality of trenches 220 formed in a P substrate 210, (2) a gate oxide layer 230 in the device region, lining the surface of the trenches 220 and extending to cover the top surface of the neighboring P substrate (or body) 210, (3) a plurality of N+ source regions 250 encompassing the DMOS trenches and extending to the top surface of the P substrate 210, and (4) a plurality of P+ regions 251 formed between two adjacent N source regions 250. The DMOS trench 220 has a bottom penetrating through an area below the P substrate 210. The inner part of the DMOS trench is filled with a gate polysilicon 241 to form a gate for the power transistor. A first isolation layer 261 and a source metal contact layer 270 cover in sequence over the gate polysilicon 241 and the gate oxide layer 230 in the device region. The source metal contact layer 270 has connections with the N source regions 250 and the P+ regions 251.

A typical gate bus is shown on the right side of FIG. 1, comprising (1) a polysilicon bus 242 formed over the P substrate 210 covered by a bus gate oxide layer 232 and (2) a second isolation layer 262 overlying the polysilicon bus 242 and the adjacent bus gate oxide layer 232 in the neighborhood and having an opening to expose the top surface of the polysilicon bus 242. Meanwhile, a gate metal conductive line 271 is connected over the polysilicon bus 242.

According to the abovementioned known trenched DMOS transistor and its gate bus structure, as shown in FIGS. 2A and 2B, a lithographic process is used, after the deposition of the polysilicon layer 240, to form a photoresist 245 for defining a location of the polysilicon bus 242 in order to form the polysilicon bus 242. Then an etching process is performed. As shown in FIG. 3, during the etching process to form the polysilicon bus 242, the charges and etching solution accumulate easily at the interface A of sidewalls of the polysilicon bus 242 and the adjacent gate oxide layer 230. Therefore, the gate oxide layer 230 at the interface A often suffers a severe etching action, so as to form micro trenches 300. Due to the formation of the micro trenches 300, more charges accumulate between the polysilicon bus 242 and the P substrate 210. It results in electric field breakdown of the gate oxide layer 230 at the interface A and the increase of current leakage.

FIG. 6 illustrates a DMOS transistor and its bus structure described in U.S. Pat. No. 6,031,265. The bus is formed from a trenched structure instead of a conventional planar one. The bus trench 221 and the DMOS trench 220 are formed in the same etching. With the subsequent blanket deposition, the polysilicon layer 240 fills the DMOS trench 220 and the bus trench 221. Then, an etchback process is directly performed with the gate oxide layer 230 as an etching stop layer. Therefore, a gate polysilicon 241 and a polysilicon bus 242 are formed respectively in the DMOS trench 220 and the bus trench 221.

According to the abovementioned bus structure design, there is no need for an additional lithographic process to form the polysilicon bus 242. However, due to the easy accumulation of the etching solution and charges on the top surface of the polysilicon bus 242 during the etching process of forming the polysilicon bus 242, the micro trenches 300 are easily formed in the gate oxide layer 230 of the adjacent bus.

BRIEF SUMMARY OF THE INVENTION

Embodiments of the present invention provide a trenched DMOS device. There is no need for an additional lithographic process to form the gate polysilicon bus structure. The early-happening electric field breakdown and the increase of current leakage, resulting from the formation of the micro trenches, can also be avoided.

An aspect of the present invention is directed to a trenched DMOS device formed atop an N+ silicon substrate with an N epitaxial layer thereon including a device region and a bus region neighboring the device region. The device region comprises a P substrate, formed in the epitaxial layer and extending to a top surface thereof. A plurality of DMOS trenches extend downward through the P substrate from a top surface thereof. A gate oxide layer is formed in the DMOS trenches and extends to cover the top surface of the P substrate. A plurality of polysilicon gates are formed in the DMOS trenches. A plurality of N+ source regions are formed in the P substrate adjacent the DMOS trenches. A plurality of P+ diffused regions are formed in the P substrate and each are interposed between two of the N+ source regions. A first isolation layer is formed over the P substrate to cover the polysilicon gate electrodes. A source metal contact layer is formed on the first isolation layer and connects to the N+ source regions and the P+ diffused regions. The bus region comprises a P substrate, formed in the epitaxial layer and extending to a top surface of the epitaxial layer. A field oxide layer is formed on the P substrate and a bus trench extends down from a top surface of the field oxide layer to a lower portion of the P substrate. A gate oxide layer is formed in the bus trench and extends to cover a top surface of the P substrate. A polysilicon bus is formed in the bus trench and has a top surface disposed at a lower level than the top surface of the field oxide layer. A second isolation layer covers the field oxide layer and has an opening to expose the polysilicon bus. A metal line is formed atop the polysilicon bus.

In some embodiments, the P substrate of the device region and the P substrate of the bus region are formed by ion implantation simultaneously. The gate oxide layer of the device region and the gate oxide layer of the bus region are formed simultaneously. The polysilicon gate and the polysilicon bus are formed by depositing a polysilicon layer in the DMOS trenches and the bus trench and using the gate oxide layers as etch stop layers to etch the polysilicon layer. The plurality of N+ source regions are formed in the P substrate on opposite sides of each of the DMOS trenches.

Another aspect of the invention is directed to a semiconductor device set which comprises at least two types of devices, each of the two types of devices having a trench feature. The first device comprises a gate oxide formed in the trench feature, a polysilicon layer formed on the gate oxide in the trench features, a first isolation layer formed on the polysilicon layer and having an opening, and a metal layer formed on the first isolation layer and filling the opening of the first isolation layer. The second device comprises a dielectric layer formed adjacent an opening at a top of the trench feature on opposite sides of the trench feature, a gate oxide formed in the trench feature and over the dielectric layer, a polysilicon layer formed on the gate oxide in the trench feature including a space near the top of the trench feature with the dielectric layer disposed on opposite sides thereof, a second isolation layer formed on the dielectric layer, and a metal layer formed on the polysilicon layer.

In some embodiments, the at least two types of devices are formed on a silicon substrate. The silicon substrate is an N substrate. The dielectric layer in the second device comprises a field oxide layer.

In accordance with another aspect of the present invention, a method of forming a trenched DMOS device comprises providing an N+ silicon substrate with an N epitaxial layer thereon, and a P substrate in the N epitaxial layer extending to a top surface thereof; forming in a device region a plurality of DMOS trenches extending downward through the P substrate from a top surface thereof, and in a bus region a field oxide layer on the P substrate and a bus trench extending down from a top surface of the field oxide layer to a lower portion of the P substrate; forming a gate oxide layer in the DMOS trenches which extends to cover the top surface of the P substrate adjacent the DMOS trenches, and a gate oxide layer in the bus trench which extends to cover the top surface of the P substrate adjacent the bus trench; forming a plurality of polysilicon gates in the DMOS trenches, and a polysilicon bus in the bus trench, the polysilicon bus having a top surface disposed at a lower level than the top surface of the field oxide layer; forming a plurality of N+ source regions in the P substrate adjacent the DMOS trenches; and forming a plurality of P+ diffused regions in the P substrate. Each of the P+ diffused regions is interposed between two of the N+ source regions. The method further comprises forming a first isolation layer over the P substrate to cover the polysilicon gates, and a second isolation layer to cover the field oxide layer, the second isolation layer having an opening to expose the polysilicon bus; and forming a source metal contact layer on the first isolation layer, and a metal line atop the polysilicon bus, the source metal contact layer connecting to the N+ source regions and the P+ diffused regions.

DETAILED DESCRIPTION OF THE INVENTION

Figure 4:
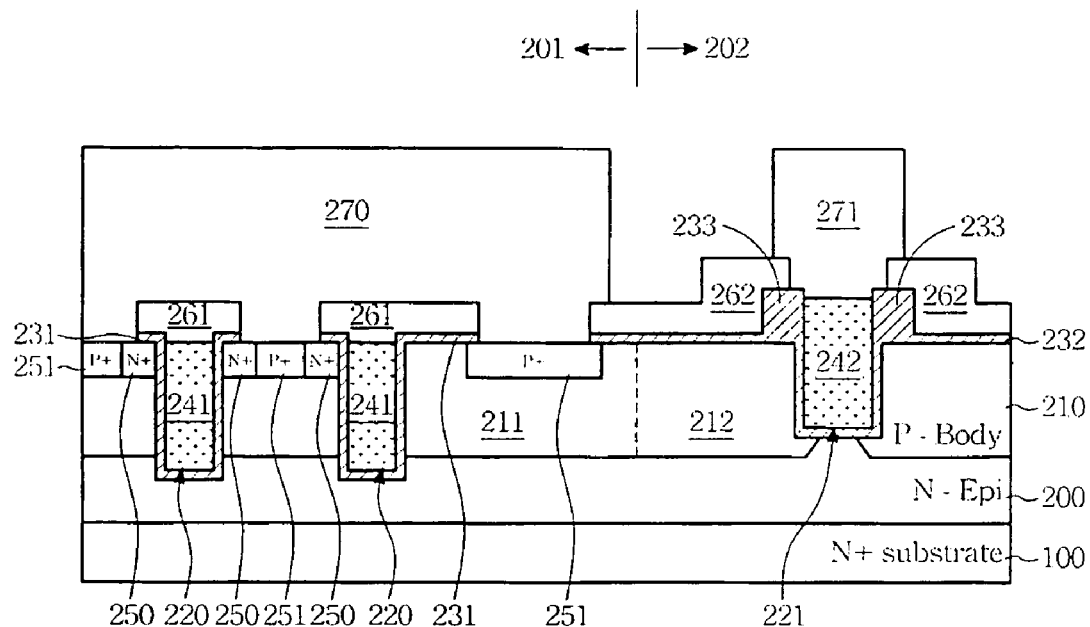
FIG. 4 depicts a schematic view of a trenched transistor and a bus structure in accordance with an embodiment of the present invention.

FIG. 4 illustrates a trenched DMOS device in accordance with an embodiment of the present invention. The trenched DMOS device comprises a device region 201 and a bus region 202 formed on an silicon substrate 100 overlied by an epitaxial layer 200. The epitaxial layer 200 is doped with N dopants, and the silicon substrate 100 is doped with N+ dopants.

The device region 201 comprises a P substrate (or body) 211 of the device region formed in the epitaxial layer 200 and extending to the surface of the epitaxial layer 200. A plurality of DMOS transistors is formed in the substrate 211 of the device region. The DMOS transistor comprises, at least, two DMOS source regions 250, a DMOS trench 220, a gate oxide layer 231 of the device region, a gate polysilicon 241, a first isolation layer 261, and a source metal layer 270.

The DMOS trench 220 extends from the top surface of the epitaxial layer 200 down into the place below the substrate 211 of the device region. The gate oxide layer 231 of the device region and the gate polysilicon 241 overlie orderly the DMOS trench 220 to form a gate in the DMOS trench. The gate oxide layer 231 of the device region extends to overlie the top surface of the adjacent P substrate 211 of the device region.

The DMOS source regions 250 of N+ dopants are formed in the substrate 211 of the device region, surrounding the DMOS trench 220. The first isolation layer 261 and the source metal layer 270 overlie orderly the gate polysilicon 241.

In addition, a plurality of P+ regions 251 are formed in the substrate 211 of the device region. Each P+ region is located between two neighboring DMOS source regions 250. The source metal layer 270 has connection with the DMOS source region 250 and the P+ region 251. Thus, when the source metal layer 270 is grounded, the DMOS source region 250 and the substrate 211 of the device region can have a zero voltage.

The bus region 202 comprises, at least, a P substrate 212 of the bus region, a gate oxide layer 232 of the bus region, a polysilicon bus 242, a second isolation layer 262, and a gate metal conductive line 271.

The substrate 212 of the bus region is located in the epitaxial layer 200 and extends to the surface of the epitaxial layer 200. A field oxide layer 233 overlies on the substrate 212 of the bus region. A trench 221 of the bus region extends from the top surface of the field oxide layer 233 down to the area below the substrate 212 of the bus region.

Moreover, the gate oxide layer 232 of the bus region caps the trench 221 and extends to cover the neighboring surface of the substrate 212 of the bus region. The polysilicon bus 242 is located in the trench 221 of the bus region. The top surface of the polysilicon bus 242 is located below the top surface of the field oxide layer 233.

The field oxide layer 233 is covered orderly by the second isolation layer 262 and the gate metal line 271. The second isolation layer 262 has an opening to connect the polysilicon bus 242 with the gate metal conductive line 271.

FIG. 5A through FIG. 5E depict a sequence of steps to form the trenched DMOS device and its gate bus according to the present invention.

Figure 5A:
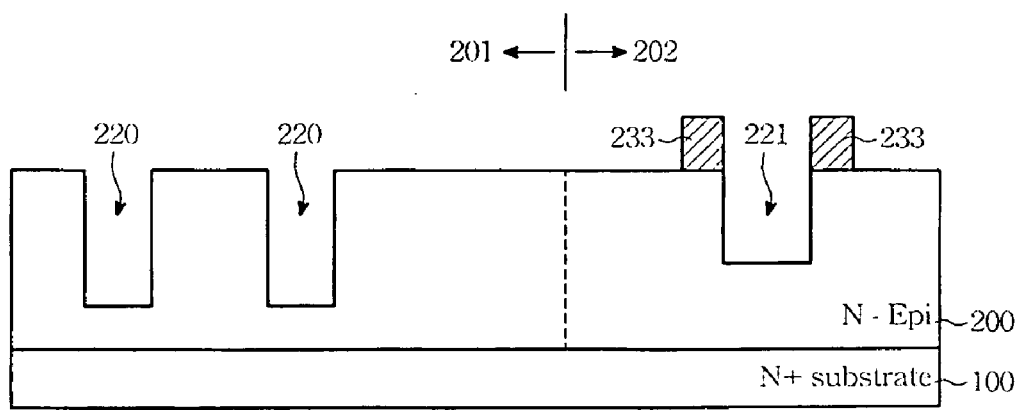
FIGS. 5A through 5E depict a sequence of steps for forming a trenched transistor and a bus structure in accordance with an embodiment of the present invention.

In FIG. 5A, first, the conventional lithographic and etching processes are performed to form a field oxide layer 233 on the top surface of a bus region 202 of the N epitaxial layer 200. The lithographic and etching processes can also be used to define an active region. Afterward, another lithographic and etching processes are performed to form DMOS trenches 220 and a bus trench 221 simultaneously.

Figure 5B:
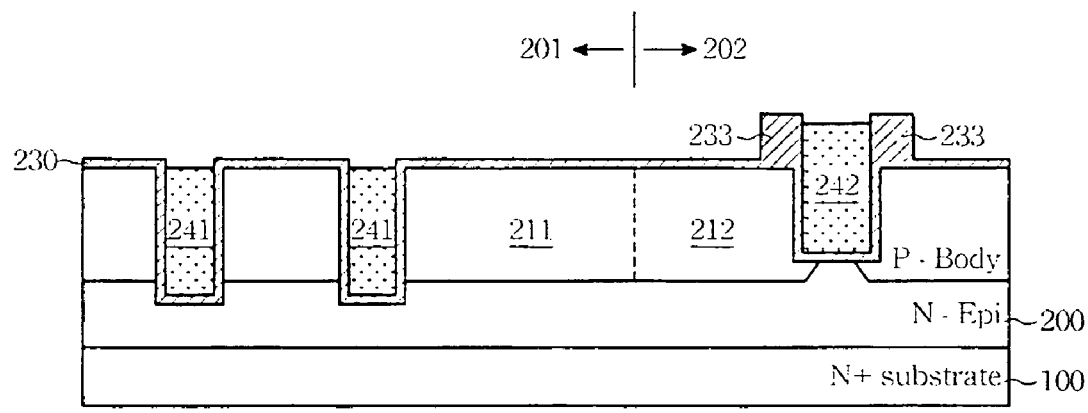

As shown in FIG. 5B, a gate oxide layer 231, 232 is formed by using a high temperature thermal oxidation. A polysilicon layer 241, 242 is deposited to fill the DMOS trench 220 and the bus trench 221. Afterward, an etchback process for the polysilicon layer 241, 242 is directly performed by using the gate oxide layer 231, 232 as an etching stop layer to form a gate polysilicon 241 and a polysilicon bus 242. Then, P dopants are implanted into the N epitaxial layer 200 in order to form the P substrate 211 of the device region and the P substrate 212 of the bus region. The bottom of the DMOS trench 220 and the bottom of the bus trench 212 are located respectively below the P substrate 211 of the device region and the P substrate 212 of the bus region.

Figure 5C:
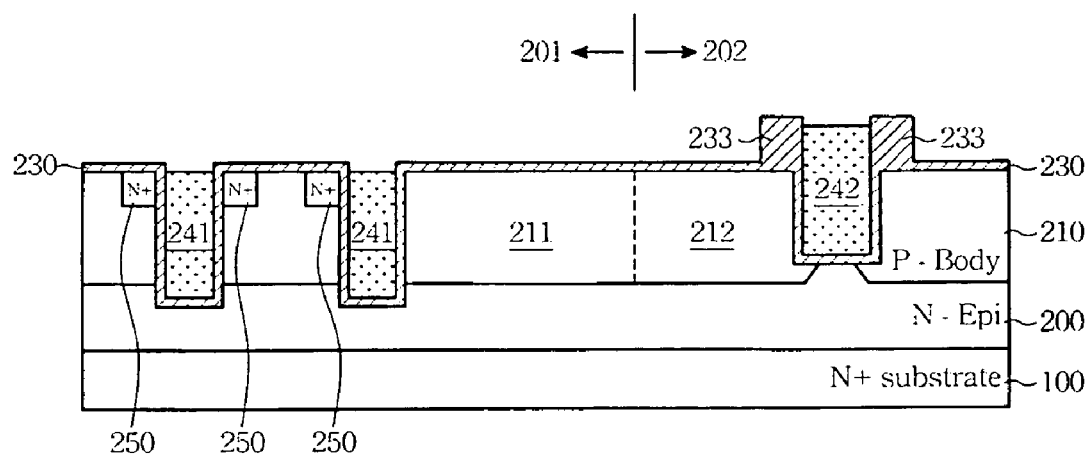

As shown in FIG. 5C, a lithographic process is performed to define the position of the DMOS source region. N dopants are implanted into the P substrate 210 to form a plurality of N+ DMOS source regions 250.

Figure 5D:
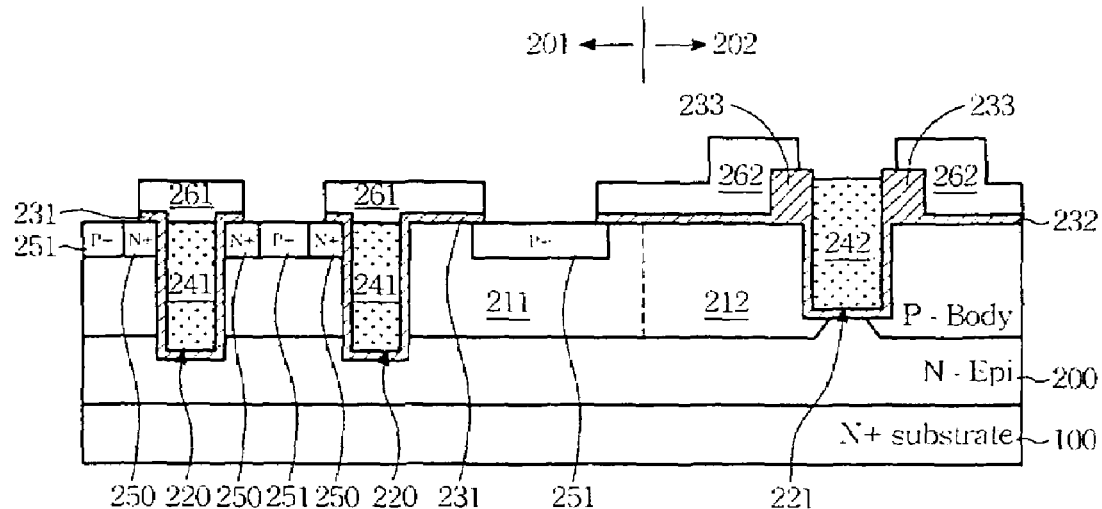

In FIG. 5D, an isolation layer is deposited. The lithographic and etching processes are performed to remove a portion of the isolation layer 261, 262 and the gate oxide layer 231, 232 between the two adjacent DMOS trenches 220 and between the bus trench 221 and the adjacent DMOS trench 220. Meanwhile, an opening is formed on the isolation layer 262 over the polysilicon bus 242. The above defines a gate oxide layer 231 of the device region, a gate oxide layer 232 of the bus region, a first isolation layer 261, and a second isolation layer 262 with an opening.

Afterward, P dopants are implanted, through the first isolation layer 261 and the second isolation layer 262, to form a plurality of P+ regions 251. Meanwhile, the N+ regions 250 are covered by the first isolation layer 261.

Thereafter, the first isolation layer 261 and the second isolation layer 262 are re-flowed to improve the cap-fill performance of the deposition of the source metal layer 270 in the following process. Then, a reflow-etching process is performed to increase the distance between the adjacent first isolation layers 261. Then, the N+ regions 250 can be exposed.

Figure 1:
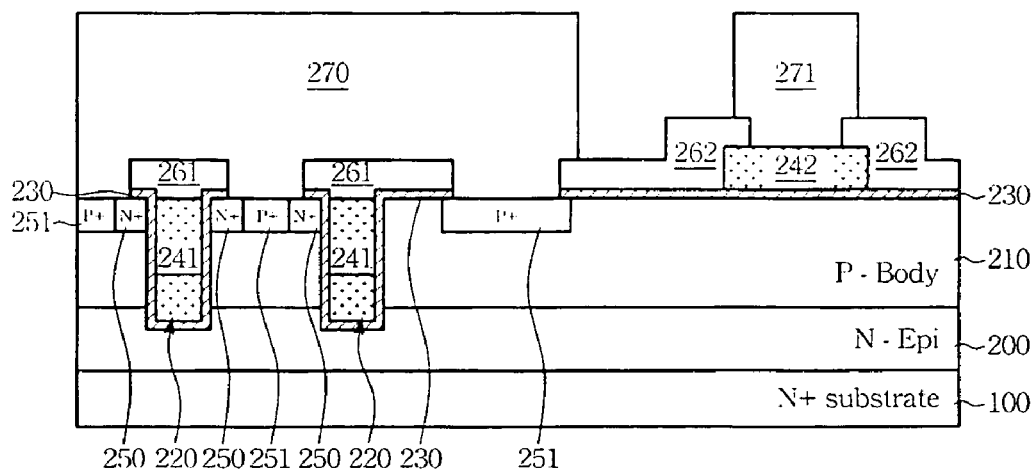
FIG. 1 depicts a schematic view of a conventional trenched DMOS transistor and a bus structure thereof.
Figure 2A:
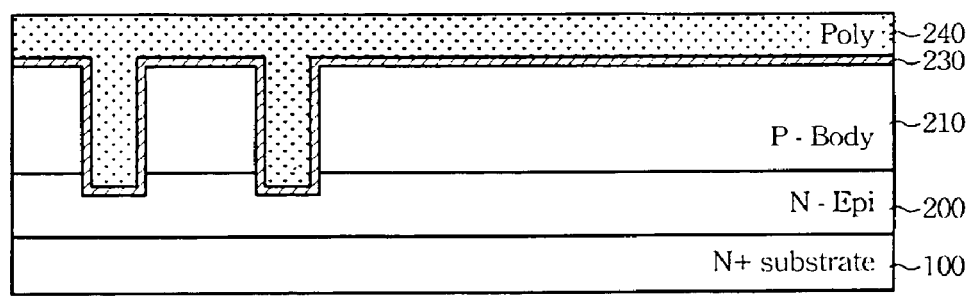
FIGS. 2A and 2B depict schematic views of a lithographic process and an etching process for forming a polysilicon bus in accordance with the bus structure shown in FIG. 1.
Figure 2B:
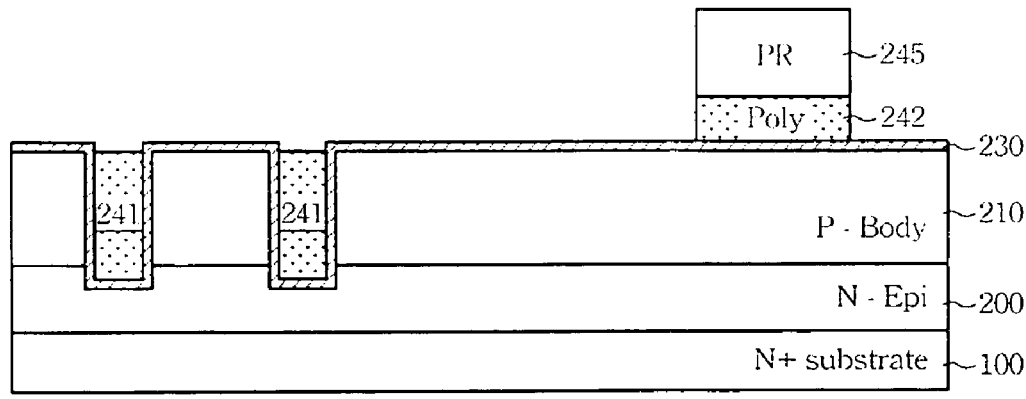
Figure 5E:
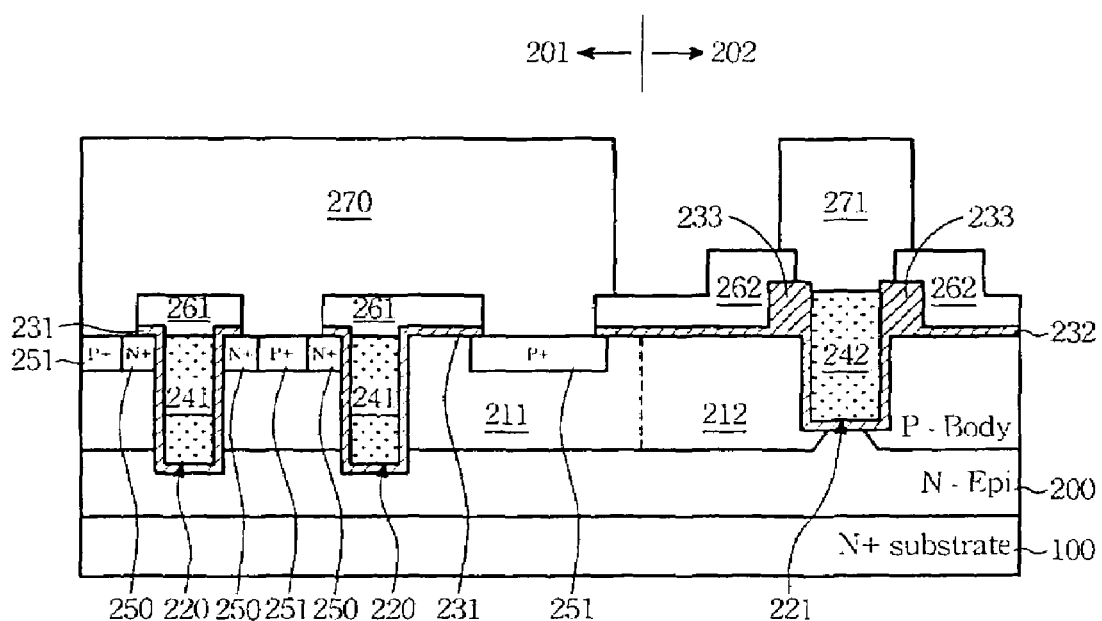

In FIG. 5E, a metal layer is deposited. Then, The lithographic and etching processes are performed. The source metal layer 270 and the gate metal conductive layer 271 are defined respectively. The source metal layer 270 is used to provide connections with a plurality of the DMOS source regions 250 and a plurality of the P+ regions 251. The gate metal conductive line 271 is used to connect with the polysilicon bus 242. Comparing the polysilicon bus 242 of the present embodiment with that of the convention process, it is found that, as shown in FIGS. 5A and 5B, the bus trench 221 and the DMOS trench 220 of the present embodiment are formed simultaneously. The gate oxide layer 231, 232 is used as an etching stop layer. The polysilicon layer is recessed to form the polysilicon bus 242 in the bus trench 221. Contrarily, as shown in FIGS. 2A and 2B, at the step of the conventional process with etch to form the DMOS trench, no bus trench is formed simultaneously. An additional lithographic process is used for defining the position of the polysilicon bus 242. Therefore, the present embodiment saves the cost for one lithographic process for defining the position of the polysilicon bus 242.

Figure 3:
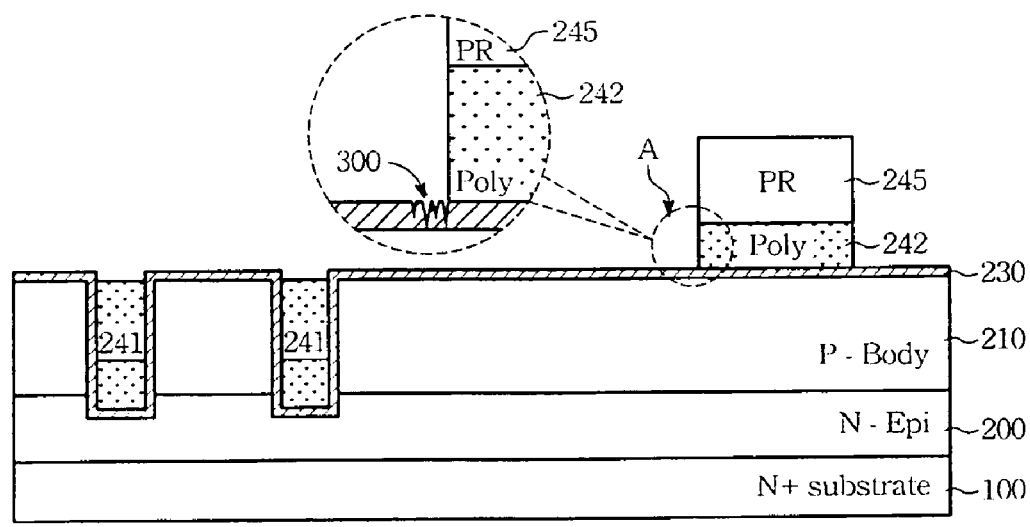
FIG. 3 depicts a schematic view of the formation of micro trenches in the gate oxide layer while etching the polysilicon material to form the polysilicon bus of FIG. 1.

Moreover, as shown in FIG. 3, in the conventional process with etch to form the polysilicon bus 242, micro trenches 300 are usually formed in the gate oxide layer 230 near the sidewalls of the polysilicon bus 242. However, as shown in FIG. 5B, in the bus structure of the trenched DMOS device of the present embodiment, the polysilicon bus 242 is located in the bus trench 221. The bus gate oxide layer 232 is near the sidewalls of the polysilicon bus 242. The top surface of the polysilicon bus 242 is near the field oxide layer 233. Therefore, micro trenches can be avoided on the bus gate oxide layer 232. Moreover, even if micro trenches are still formed on the top surface of the field oxide layer 233 near the polysilicon bus 242, the performance will not be affected. Thus, the problems resulting from micro trenches can be solved.

Figure 6:
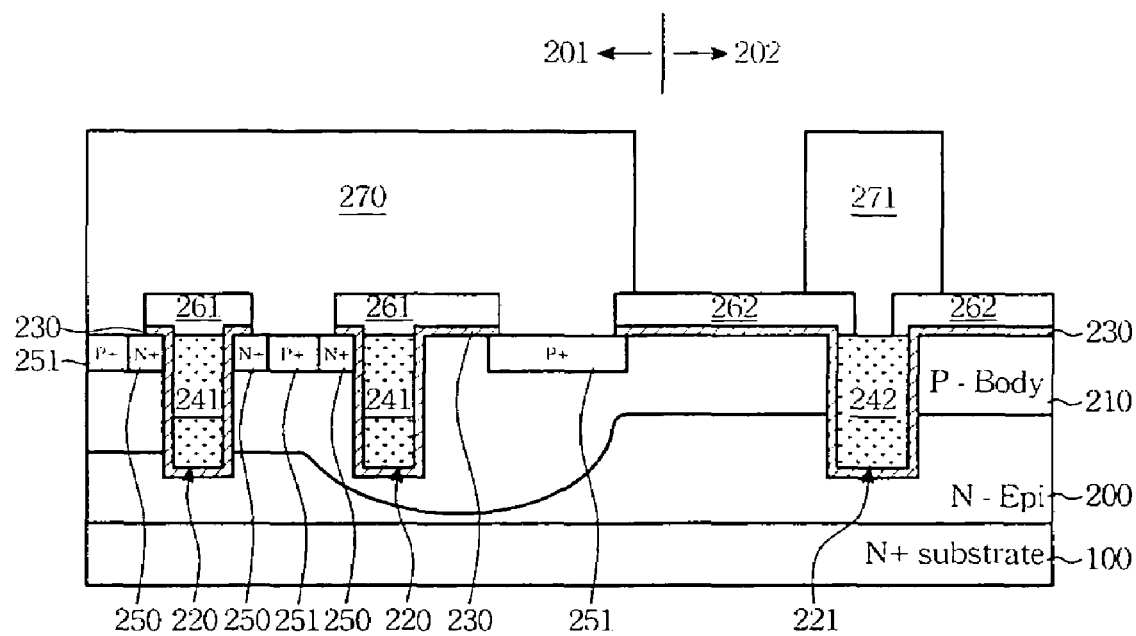
FIG. 6 depicts a schematic view of another prior trenched transistor and a bus structure.

In addition, as shown in FIG. 6, according to the DMOS transistor and its bus structure described at U.S. Pat. No. 6,031,265, there is no need for one lithographic process to define the polysilicon bus 242 in the bus structure. However, the top surface of the polysilicon bus 242 is near the gate oxide layer 230. Therefore, during the etching process for forming the polysilicon bus 242, the etching solution and charges can easily accumulate on the top surface of the polysilicon bus 242. Therefore, it leads to the formation of micro trenches 300 on the bus gate oxide layer 232 of the top surface of the neighboring polysilicon bus 242. Contrarily, as shown in FIG. 5B, the top surface of the polysilicon bus 242 is near the field oxide layer 233. Therefore, micro trenches can be avoided on the bus gate oxide layer 232. Moreover, even if micro trenches are still formed on the top surface of the field oxide layer 233 near the polysilicon bus 242, the DMOS performance will not be affected.

With the example and explanations above, the features and spirits of the invention will be hopefully well described. Those skilled in the art will readily observe that numerous modifications and alterations of the device may be made when retaining the teaching of the invention. Accordingly, the above disclosure should be construed as limited only by the metes and bounds of the appended claims.

What is claimed is:

1. A trenched DMOS device formed atop an N+ silicon substrate with an N epitaxial layer thereon including a device region and a bus region neighboring the device region, the device region comprising:
   a P substrate, formed in the epitaxial layer and extending to a top surface thereof, a plurality of DMOS trenches extending downward through the P substrate from a top surface thereof;
   a gate oxide layer formed in the DMOS trenches and extending to cover the top surface of the P substrate;
   a plurality of polysilicon gates formed in the DMOS trenches;
   a plurality of N+ source regions formed in the P substrate adjacent the DMOS trenches;
   a plurality of P+ diffused regions formed in the P substrate and each being interposed between two of the N+ source regions;
   a first isolation layer formed over the P substrate to cover the polysilicon gate electrodes; and
   a source metal contact layer formed on the first isolation layer and connecting to the N+ source regions and the P+ diffused regions;
   and the bus region comprising:

a P substrate, formed in the epitaxial layer and extending to a top surface of the epitaxial layer, a field oxide layer being formed on the P substrate and a bus trench extending down from a top surface of the field oxide layer to a lower portion of the P substrate;

a gate oxide layer formed in the bus trench and extending to cover a top surface of the P substrate;

a polysilicon bus formed in the bus trench and having a top surface disposed at a lower level than the top surface of the field oxide layer;

a second isolation layer covering the field oxide layer and having an opening to expose the polysilicon bus; and a metal line formed atop the polysilicon bus.

2. The trenched DMOS device of claim 1, wherein the P substrate of the device region and the P substrate of the bus region are formed by ion implantation simultaneously.

3. The trenched DMOS device of claim 1, wherein the gate oxide layer of the device region and the gate oxide layer of the bus region are formed simultaneously.

4. The trenched DMOS device of claim 1, wherein the polysilicon gate and the polysilicon bus are formed by depositing a polysilicon layer in the DMOS trenches and the bus trench and using the gate oxide layers as etch stop layers to etch the polysilicon layer.

5. The trenched DMOS device of claim 1, wherein the plurality of N+ source regions are formed in the P substrate on opposite sides of each of the DMOS trenches.

6. A semiconductor device set which comprises at least two types of devices, each of the two types of devices having a trench feature;

wherein the first device comprises a gate oxide formed in the trench feature, a polysilicon layer formed on the gate oxide in the trench features, a first isolation layer formed on the polysilicon layer and having an opening, and a metal layer formed on the first isolation layer and filling the opening of the first isolation layer; and wherein the second device comprises a dielectric layer formed adjacent an opening at a top of the trench feature on opposite sides of the trench feature which extends downward from a top surface of the dielectric layer, a gate oxide formed in the trench feature and over the dielectric layer, a polysilicon layer formed on the gate oxide in the trench feature including a space below the top of the trench feature between the top surface of the dielectric layer and an upper surface of the polysilicon layer with the dielectric layer disposed on opposite sides thereof, a second isolation layer formed on the dielectric layer and having an opening to expose the polysilicon layer, and a metal layer formed on the polysilicon layer.

7. The semiconductor device set of claim 6, wherein the at least two types of devices are formed on a silicon substrate.

8. The semiconductor device set of claim 7, wherein the silicon substrate has an epitaxial layer formed thereon.

9. The semiconductor device set of claim 8, wherein the epitaxial layer has a P substrate thereon.

10. The semiconductor device set of claim 9, wherein each trench feature extends through the P substrate to an area below a top surface of the epitaxial layer.

11. The semiconductor device set of claim 9, wherein a plurality of N source regions and a plurality of P regions are formed in the P substrate.

12. The semiconductor device set of claim 11, wherein at least two of the N source regions formed in the P substrate are disposed adjacent to and on opposites sides of one of the first devices, and wherein at least one of the P regions formed in the P substrate is disposed between two adjacent N source regions.

13. The semiconductor device set of claim 8, wherein the epitaxial layer is an N epitaxial layer.

14. The semiconductor device set of claim 7, wherein the silicon substrate is an N substrate.

15. The semiconductor device set of claim 6 wherein the dielectric layer in the second device comprises a field oxide layer.

* * * * *